US 6,566,244 B1

(12) United States Patent
May et al.

(10) Patent No.: US 6,566,244 B1
(45) Date of Patent: May 20, 2003

(54) PROCESS FOR IMPROVING MECHANICAL STRENGTH OF LAYERS OF LOW K DIELECTRIC MATERIAL

(75) Inventors: Charles E. May, Gresham, OR (US); Venkatesh P. Gopinath, Fremont, CA (US); Peter J. Wright, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/138,609

(22) Filed: May 3, 2002

(51) Int. Cl.$^7$ .......................................... H01L 21/4763
(52) U.S. Cl. ...................... 438/622; 438/623; 438/624; 438/637
(58) Field of Search ................................ 438/622, 623, 438/624, 637

(56) References Cited

U.S. PATENT DOCUMENTS

| 5,874,367 | A | | 2/1999 | Dobson ....................... 438/787 |
| 6,309,956 | B1 | * | 10/2001 | Chiang et al. ............... 438/622 |
| 6,313,024 | B1 | * | 11/2001 | Cave et al. .................. 438/598 |
| 6,368,952 | B1 | * | 4/2002 | Liang et al. ................. 438/622 |
| 6,432,811 | B1 | * | 8/2002 | Wong .......................... 438/619 |

OTHER PUBLICATIONS

Bothra, S., et al., "Integration of 0.25 μm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced SiO$_2$ Planarization Using Silane and H$_2$O$_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

* cited by examiner

Primary Examiner—T. N. Quach
(74) Attorney, Agent, or Firm—John P. Taylor

(57) ABSTRACT

A process for selectively reinforcing portions of a low k dielectric material which comprises first forming a low k dielectric layer, then forming openings in the low k layer in portions of the low k layer needing reinforcement, and then filling the openings with reinforcing material, preferably reinforcing material having a higher Young's modulus of elasticity than the low k dielectric material. Such selective reinforcement of certain portions of low k dielectric material may comprise selectively reinforcing the low k dielectric material beneath the bonding pads, with reinforcing material. The low k dielectric material may be reinforced by openings in the low k dielectric material formed beneath portions of the low k dielectric layer where a capping layer will be formed over the low k dielectric material. Subsequent formation of the capping layer will simultaneously fill the openings with capping material, which may then also function as reinforcement material in the openings.

14 Claims, 3 Drawing Sheets

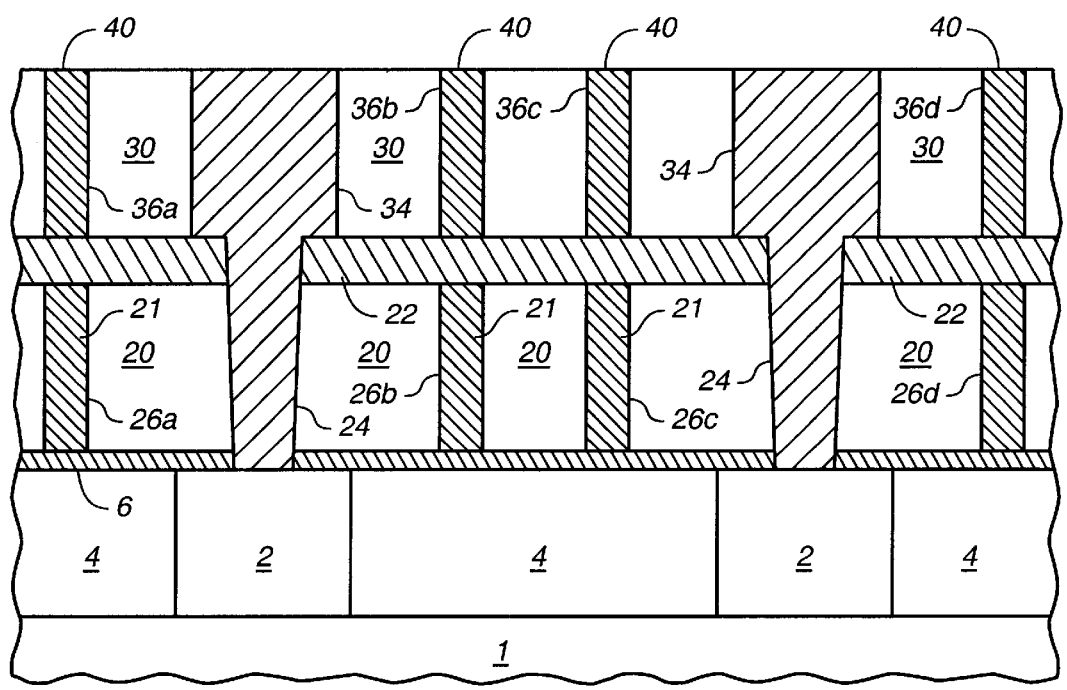
FIG._1

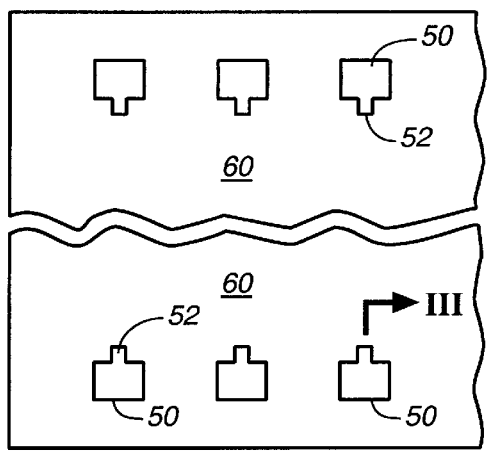
FIG._2
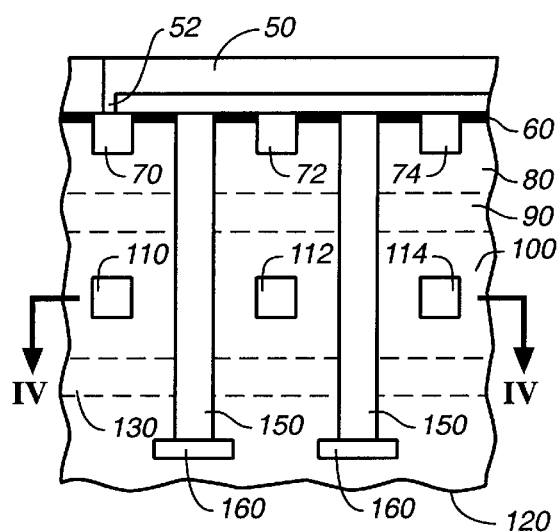
FIG._3
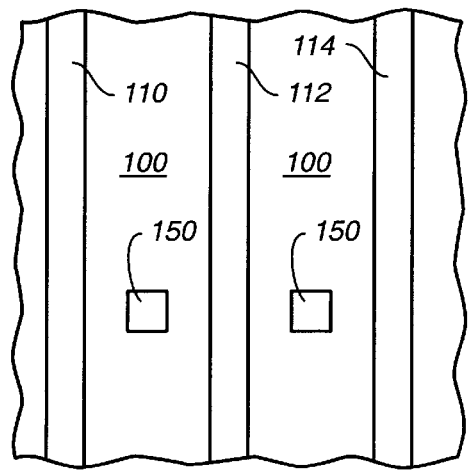
FIG._4
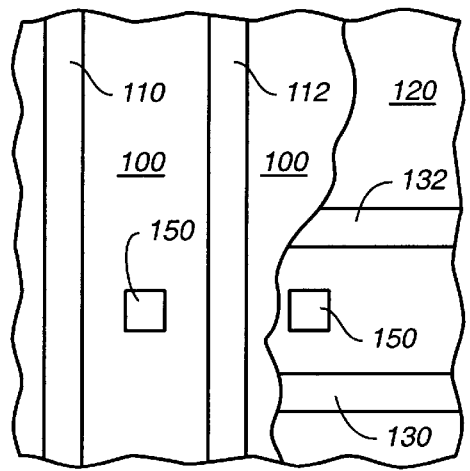
FIG._5

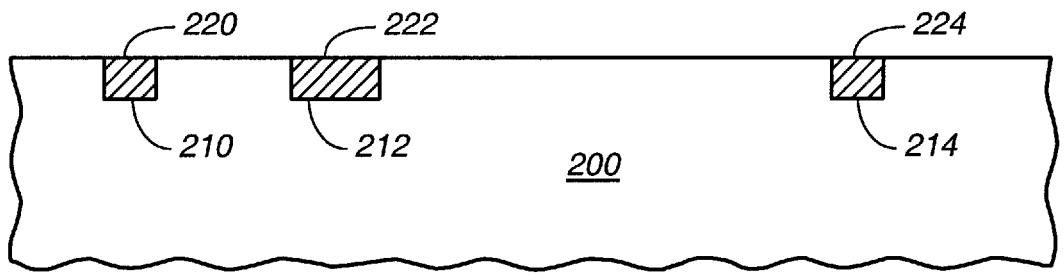
FIG._6
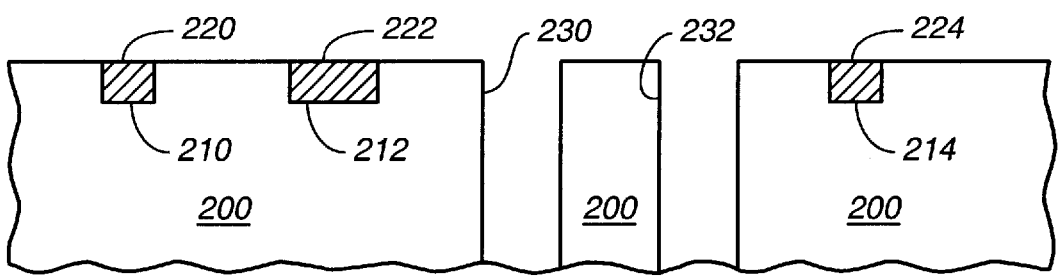
FIG._7
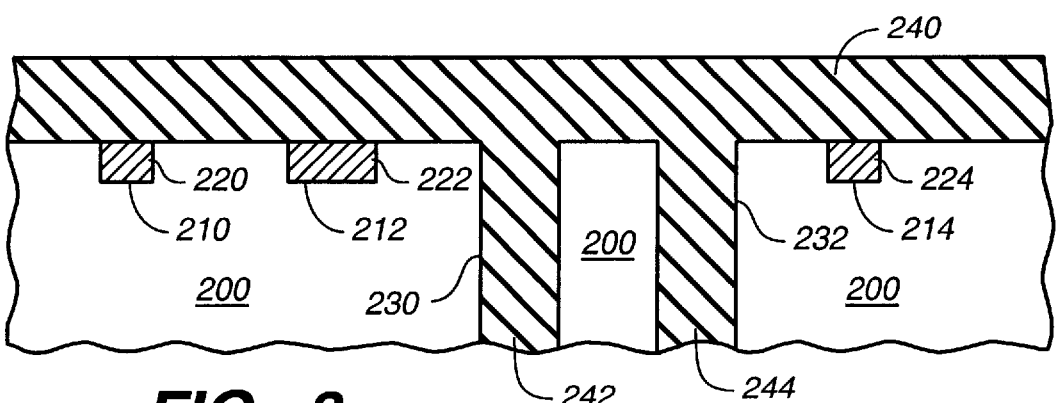
FIG._8

PROCESS FOR IMPROVING MECHANICAL STRENGTH OF LAYERS OF LOW K DIELECTRIC MATERIAL

BACKGROUND OF THE INVENTION

1. Field of the Invention

This invention relates to the formation of integrated circuit structures. More particularly, this invention relates to the formation of a structure comprising one or more layers of low k dielectric material having support structures therein to provide enhanced mechanical strength to the low k dielectric material.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U. K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (DUMIC) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

While such low k dielectric materials provide the needed reduction in capacitance by reduction in the dielectric constant (k) of the dielectric material, an undesired effect is reduction in mechanical strength as well. It has ben noted that, in general, the lower the dielectric constant of the dielectric material, the lower its strength becomes (as measured by Young's modulus of elasticity), probably because of the nature of the additives incorporated into the low k dielectric material and a reduction in the film density caused by micro-pores to achieve the desired reduction in dielectric constant.

This loss of mechanical strength was noted in Catabay and Hsia U.S. patent application Ser. No. 09/999,046, mailed to the USPTO by Express Mail on Oct. 26, 2001, assigned to the assignee of this patent application, and the subject matter of which is hereby incorporated herein by reference. Catabay and Hsia noted that when vias and/or trenches are formed in a layer or layers of such low k dielectric material and the resulting openings are filled with liner and filler materials, and when a polishing processing, such as a chemical mechanical polishing process (CMP), is used to remove excess filler and liner materials from the upper surface of the layer of low k dielectric material, the wafer pressure and the sheer strength of the polishing process could promote defects in the layer or layers of such weakened low k dielectric materials such as cracks and/or delamination. Sometimes even though the low k film made it through the CMP process without cracking, they noted that the low k film sometimes cracked during later processing such as packaging.

They proposed to add mechanical strength to such low k integrated circuit structures by reinforcing each layer of low k dielectric material, as it was constructed, This is shown in FIG. 1 wherein a layer comprising metal lines 2 and low k dielectric material 4 is formed over an integrated circuit structure 1 and capped with a barrier layer 6. A first layer 20 of low k dielectric material is then formed over barrier layer 6.

Openings 26a–26d are then formed in layer 20 of low k dielectric material (terminating at barrier layer 6) and these openings are then filled with reinforcement material 21 having a higher Young's modulus of elasticity than that of layer 20 of low k dielectric material to thereby provide mechanical reinforcement to portions of low k dielectric layer 20 between vias 24.

The formation of etch stop or barrier layer 22 over the resulting first reinforced layer is illustrative of the layer by layer formation of the reinforcement shown in FIG. 1. The top surface of first reinforced layer 20 of low k dielectric material and reinforcement material 21 is covered with etch stop or barrier layer 22 which, as will be described below, then separates subsequently formed reinforced layers from the just described first reinforced layer comprising layer 20 of low k dielectric material and reinforcement material 21.

Still referring to FIG. 1, a further layer of low k dielectric material 30 is shown formed over low k layer 20 and reinforced by high Young's modulus of elasticity reinforcement material 40 formed in openings 36a–36d in low k dielectric layer 30. Reinforcement material 40 also has a higher Young's modulus of elasticity than the low k dielectric material 30 shown being reinforced, i.e. similar to the previously described relationship between reinforcing material 21 and low k dielectric material 20. It will be noted however, that openings 26a–26d in low k dielectric layer 20 filled with reinforcing material 21 are aligned with, but physically separated from, openings 36a–36d by the formation of barrier layer 22 after formation and reinforcement of low k dielectric layer 20. Low k dielectric layer 40 is further shown with trench openings 34 formed therein in alignment and contiguous with vias 24 in layer 20, as in a dual damascene construction.

While Catabay and Hsia thus reinforced the regions of low k dielectric material in their integrated circuit structure on a layer by layer basis throughout their integrated circuit structure, we have noted that often the damage seems to be concentrated in the bond pad regions of the integrated circuit structure. Such bond pad regions can tear off from the remainder of the integrated circuit structure, resulting in a bonding failure, probably because of the localized stresses created in these regions of the integrated circuit structure by wire bond pressure and vibration. This observation is of particular interest since portions of the integrated circuit not under the bonds pads have high speed logic circuitry where a higher k reinforcement material may not be needed and would be particularly undesirable if present.

It would, therefore, be desirable to optimize the reinforcement of mechanically weak low k dielectric material, both with regard to shape and position of the reinforcing material in the integrated circuit structure.

SUMMARY OF THE INVENTION

Selective reinforcement of certain regions of an integrated circuit containing low k dielectric material comprises reinforcing low k dielectric material selectively, in regions of the integrated circuit structure beneath the bonding pads, with reinforcing material having a higher Young's modulus of elasticity; and optionally extending such reinforcement material vertically and contiguously through multiple underlying layers of the integrated circuit structure.

BRIEF DESCRIPTION OF THE DRAWINGS

FIG. 1 is a fragmentary vertical cross-sectional view of the reinforced integrated circuit structure of Catabay and Hsia showing the layer by layer formation of reinforced low k dielectric material.

FIG. 2 is a fragmentary top view of portions of the top surface of an integrated circuit structure showing a portion of the area having bonding pads formed thereon.

FIG. 3 is a fragmentary vertical cross-sectional view of a portion of the integrated circuit structure of FIG. 2 taken along lines III—III illustrating the selective reinforcement of low k dielectric material beneath a bonding pad.

FIG. 4 is an elevated view of the structure of FIG. 3 taken along lines IV—IV.

FIG. 5 is a partially cutaway elevated view of the structure shown in FIG. 4.

FIG. 6 illustrates another embodiment of the invention comprising a fragmentary vertical cross-sectional view of a portion of an integrated structure showing copper lines formed in the top surface of a layer of low k dielectric material.

FIG. 7 is a fragmentary vertical cross-sectional view of the structure of FIG. 6 after formation of generally vertical openings, capable of receiving reinforcement material therein, formed in the low k dielectric layer in regions of the low k dielectric layer needing reinforcement.

FIG. 8 is a fragmentary vertical cross-sectional view of the structure of FIG. 7 after formation of a capping layer of dielectric material over the copper lines and at the same time filling the generally vertical openings with the capping material to thereby simultaneously form a capping layer over the copper lines, and reinforcement in the low k dielectric material.

DETAILED DESCRIPTION OF THE INVENTION

The invention comprises a process for selectively reinforcing portions of a low k dielectric material which comprises first forming a layer of the low k dielectric material to be reinforced, then forming openings in the layer of low k dielectric material in portions of the low k layer needing reinforcement, and then filling the openings with reinforcing material, preferably reinforcing material having a higher Young's modulus of elasticity than the low k dielectric material.

In one embodiment, such selective reinforcement of certain portions of low k dielectric material comprises selectively reinforcing the low k dielectric material in portions of the integrated circuit structure beneath the bonding pads, with reinforcing material.

In another embodiment, the low k dielectric material is reinforced by providing openings in the low k dielectric material beneath at least some portions of the low k dielectric material where a capping layer will be formed over the low k dielectric material. Each opening is then filled with capping material (which also serves as the reinforcing material) while forming the capping layer over the low k dielectric material, whereby the reinforcement material may be formed in the low k dielectric material in the same step used to form the capping layer over the low k dielectric material.

Optionally, in any of the embodiments such reinforcement material may be extended vertically and contiguously through multiple underlying layers of the integrated circuit structure.

Turning now to FIGS. 2–5, selective reinforcement of the low k dielectric material beneath the bonding pads is illustrated. FIG. 2 is a fragmentary top view of a portion of an integrated circuit structure severed to show portions of two sides of the top of the integrated circuit structure.

Portions of both rows of conventional bonding pads 50 are shown in both FIGS. 2 and 3 mounted in top surface 60 of the integrated circuit structure. Top surface 60 may comprise a capping layer or layers of insulating material which may comprise silicon oxide ($SiO_2$), silicon nitride, or silicon carbide.

Bonding pads 50 are shown with each having a contact finger 52 thereon which is metallurgically joined to an underlying line or contact. FIG. 3 shows contact finger 52 on bonding pad 50 metallurgically connected to electrically conductive line 70 which usually will comprise a metal line such as, for example, an aluminum, tungsten, or copper line. Electrically conductive line 70 may be one of a number of generally parallel lines comprising one layer of interconnects, as illustrated by lines 72 and 74 in FIG. 3, with each electrically conductive line electrically insulated from adjacent lines by dielectric material 80 which, in the present invention, comprises low k dielectric material. While low k dielectric material 80 between lines 70, 72, and 74 is shown as a single layer of dielectric material, it will be understood that multiple layers of one or more types of dielectric materials (as well as capping layers, barrier layers, bonding layers, etc.) may be used for each layer of electrically conductive interconnects. This is also true for dielectric materials 100, and 120 to be discussed below.

Still referring to FIG. 3, it will be noted that a number of additional layers of electrically conductive interconnects are positioned in the integrated circuit structure below the layer containing lines 70–74, with dotted lines 90 representing one of a number of electrically conductive lines disposed in a parallel plane beneath lines 70–74 and shown running at an angle to lines 70–74. Another plane of electrically conductive lines 110, 112, and 114 is shown below line 90, with low k dielectric material 100 shown disposed around lines 110–114. Yet another layer of conductive interconnects 130 is represented by the dotted lines below lines 110–114, with further low k dielectric material 120 shown below dotted lines 130.

In accordance with the invention, the layers of low k dielectric material located generally beneath bonding pad 50, represented in FIG. 3 by low k dielectric materials 80, 100, and 120, is reinforced by provision of reinforcement bars or rods 150 which are shown in FIG. 3 disposed normal to the planes of conductive interconnects 70–74, 90, 110–114, 130, & 132 (FIG. 5) and low k dielectric layers 80, 100, and 120.

Reinforcement bars 150 are preferably constructed by etching openings into the integrated circuit structure normal to the planes of the layers of low k dielectric material and the planes of the conductive interconnects down to an etch stop such as shown at 160 in FIG. 3. Reinforcement rods 150 may be formed of an insulation material such as silicon oxide ($SiO_2$), silicon nitride, or silicon carbide, or a metal such as tungsten, tungsten nitride, tantalum, or tantalum nitride.

However, regardless of whether the material used to form reinforcement rods 150 is a metal (or other electrically conductive material) or a dielectric material, the reinforcement material must be mechanically stronger than the low k dielectric material which it is reinforcing. This relative strength may be defined by Young's modulus of elasticity, i.e., the reinforcing material must have a higher Young's modulus of elasticity than that of the material being reinforced. In some instances, the reinforcement rods will preferably comprise a low k dielectric material having a higher mechanical strength (as defined by its Young's modulus of elasticity) compared to that of the low k dielectric layers surrounding the conductive interconnects.

By use of the term "low k dielectric material", with respect to the dielectric constants of the reinforcement material, is meant any dielectric material having a dielectric constant below about 4 (the nominal dielectric constant of conventional silicon oxide), and preferably below about 3.5. Such a low k dielectric reinforcement material will have a Young's modulus of elasticity of at least 10.

The use of the term "low k dielectric material", with respect to the dielectric material being reinforced, is meant any dielectric material having a dielectric constant below about 3 and preferably about 2.5 or lower.

Low k dielectric materials having a Young's modulus of elasticity sufficiently high to be capable of functioning as the low k dielectric material used for the reinforcement of a layer of low k dielectric material include the following dielectric materials (by way of example): PECVD TEOS or $SiH_4$ FSG (having a dielectric constant of 3.6 and available from Novellus or AMAT); and carbon-doped or undoped Flowfill (having a dielectric constant of 3.3 to 4.0 and available from Trikon).

Low k dielectric materials suitable for use as the low k dielectric material usually occupying the majority of the volume of the integrated circuit structure (i.e., the material being reinforced) include low k carbon-doped silicon oxide dielectric material formed by reacting together at a low temperature a mild oxidizing agent such as hydrogen peroxide with a carbon-doped silane. Low k dielectric materials such as this are commercially available from Trikon Technologies of Newport, Gwent, U. K.

Other commercially available low k dielectric materials suitable for use as one or more of the layers of low k dielectric material include:

| LOW K DIELECTRIC MATERIAL SOURCE AND PRODUCT NAME | DIELECTRIC CONSTANT |
| --- | --- |
| Applied Materials Black Diamond Family (eg. BDI, BDII) | 2.4 to 3.0 |
| Novellus CORAL Family | 2.4 to 3.0 |
| ASM International AURORA | 2.5 to 3.0 |
| Dow Chemical SiLK | 2.65 |
| Dow Corning XLK | 2.0 to 2.4 |
| JSR LKD | 2.0 to 2.4 |
| Trokon Orion Low k | 2.2 |
| Dow Chemical Porous SiLK | 2.0 to 2.4 |
| Applied Materials ELK | 2.0 to 2.4 |

Turning now to FIGS. 6–8, another embodiment is illustrated wherein reinforcement of one or more layers of low k dielectric material is consolidated with formation of a capping layer over the low k dielectric material. The one or more layers of low k dielectric material to be reinforced are generally designated at 200 in FIGS. 6–8, and will be collectively referred to hereinafter as low k layer 200 by way of illustration only, and not of limitation, it being understood that low k layer 20 may comprises a plurality of layers of low k material to be simultaneously reinforced by the same reinforcement rods by the process of the invention.

Formed in the upper surface 204 of low k dielectric layer 200 are a plurality of trenches 210, 212, and 214, each filled with a conductive material such as, for example, tungsten or copper, as shown respectively at 220, 222, and 224. Thus, a metal interconnect layer is formed in the top surface of low k dielectric layer 200. Conventionally, after completion of such operations, the upper surface of the low k dielectric layer is sealed off with a capping layer of a dielectric material such as silicon oxide ($SiO_2$), silicon nitride, or silicon carbide to protect the low k dielectric material from deleterious interaction with contaminates, including moisture.

In accordance with this embodiment of the invention, prior to formation of such a capping layer over the upper surface of low k dielectric layer 200 and the upper surfaces of filled trenches 210, 212, and 214, openings 230 and 232 are etched generally vertically from the upper surface of low k dielectric layer 200 into layer 200. These openings will permit the in situ formation of reinforcement rods 242 and 244 in openings 230 and 232 when capping layer 240 is subsequently formed.

The depth of openings 230 and 232 will vary with the need for reinforcement of low k dielectric layer 200 as well as the layout of the components of the integrated circuit structure. Etch stops may be provided, as shown at 160 in FIG. 3 of the prior embodiment, to control the total depth of openings 230 and 232 and to provide uniformity in the process. The etch stop layer may be either a dielectric material or a conductor, depending upon the material being etched and the etchant.

After formation of openings 230 and 232 in layer 200, a capping layer 240 of insulating material such as silicon oxide ($SiO_2$), silicon nitride, or silicon carbide is then formed over the top surface of low k layer 200 which also fills openings 230 and 232 at the same time as it forms capping layer 240, thereby forming reinforcement rods 242 and 244 at the same time as capping layer 240 is formed. To avoid the formation of a non-homogeneous upper surface on capping layer 240, the width or diameter of openings 230 and 232 is controlled to not exceed about twice the thickness of capping layer 240 over portions of low k layer 200 where no such reinforcement openings are formed.

Thus, by the prior provision of openings, such as openings 230 and 232, in low k layer 200 before formation of capping layer 240 over low k dielectric layer 200, and by use of the same material to form both the capping layer and the reinforcement material, simultaneous formation of capping layer 240 over low k dielectric layer 200, and the reinforcing members 242 and 244 within low k dielectric layer 200, may be carried out.

Having thus described the invention what is claimed is:

1. A process for selectively reinforcing portions of a low k dielectric material of an integrated circuit structure which comprises:
    a) first forming a plurality of layers of low k dielectric material to be reinforced;
    b) then selectively forming openings contiguously and generally vertically in said plurality of underlying layers of low k dielectric material in portions of said plurality of low k layers needing reinforcement; and
    c) then filling said openings with reinforcing material to thereby selectively reinforce said portions of said plurality of low k layers needing reinforcement with rods of reinforcing material having a higher Young's modulus of elasticity than any of said plurality of layers of low k dielectric material.

2. The process of claim 1 wherein said selective reinforcement of portions of said low k dielectric material further comprises selectively reinforcing, with said rods of reinforcing material, at least some of said low k dielectric material in portions of said integrated circuit structure beneath bonding pads.

3. The process of claim 1 wherein said selective reinforcement of portions of said low k dielectric material further comprises:
    a) selectively forming a majority of said openings in portions of said integrated circuit structure beneath bonding pads; and
    b) then filling said openings with said reinforcing material to reinforce said low k dielectric material with rods of said reinforcing material.

4. The process of claim 1 wherein said reinforcing material is selected from the group consisting of silicon oxide ($SiO_2$), silicon nitride, silicon carbide, tungsten, tungsten nitride, tantalum, and tantalum nitride.

5. The process of claim 1 wherein said reinforcing material comprises a conductor.

6. The process of claim 1 wherein said reinforcing material comprises a dielectric material.

7. The process of claim 1 wherein said low k dielectric material to be reinforced comprises a low k carbon-doped silicon oxide dielectric material formed by reacting together a mild oxidizing agent with a carbon-doped silane.

8. A process for reinforcing low k dielectric material in an integrated circuit structure with reinforcement material which comprises:
    a) providing generally vertical openings contiguously through a plurality of underlying layers of said low k dielectric material beneath portions of said low k dielectric material where a layer of capping material will be formed over said low k dielectric material; and
    b) then filling such openings with capping material having a higher Young's modulus of elasticity than any of said one or more layers of low k dielectric material while forming said capping layer over said low k dielectric material whereby said capping material in said openings serves as reinforcement material for said plurality of layers of low k dielectric material.

9. The process of claim 8 wherein said selective reinforcement of portions of said low k dielectric material further comprises selectively reinforcing, with said reinforcing material, at least some of said low k dielectric material in portions of said integrated circuit structure beneath bonding pads.

10. The process of claim 8 wherein said selective reinforcement of portions of said low k dielectric material further comprises:
    a) selectively forming a majority of said openings in portions of said integrated circuit structure beneath bonding pads; and
    b) then filling said openings with said reinforcing material to reinforce said low k dielectric material.

11. The process of claim 8 wherein said reinforcing material is selected from the group consisting of silicon oxide ($SiO_2$), silicon nitride, and silicon carbide.

12. The process of claim 8 wherein said low k dielectric material to be reinforced comprises a low k carbon-doped silicon oxide dielectric material formed by reacting together a mild oxidizing agent with a carbon-doped silane.

13. A process for selectively reinforcing portions of a low k dielectric material of an integrated circuit structure which comprises:
    a) first forming two or more layers of low k dielectric material to be reinforced;
    b) then selectively forming openings contiguously through said two or more layers of said low k dielectric material of said integrated circuit structure in said portions of said two or more low k layers needing reinforcement; and
    c) then filling said openings with reinforcing material selected from the group consisting of conductors and dielectric materials to thereby selectively reinforce said portions of said one or more low k layers needing reinforcement.

14. A process for selectively reinforcing portions of a low k dielectric material of an integrated circuit structure which comprises:
    a) first forming two or more layers of low k dielectric material to be reinforced;
    b) then selectively forming openings contiguously through said two or more layers of said low k dielectric material of said integrated circuit structure in said portions of said two or more low k layers needing reinforcement; and
    c) then filling said openings with reinforcing material selected from the group consisting of conductors and dielectric materials to thereby form reinforcing rods which will selectively reinforce said portions of said two or more low k layers needing reinforcement.

* * * * *